(12) United States Patent
Kuit et al.

(10) Patent No.: US 9,874,607 B1
(45) Date of Patent: Jan. 23, 2018

(54) METHOD AND APPARATUS FOR USING PROGRAMMABLE LOGIC CIRCUITRY TO TEST ON-CHIP ANALOG-TO-DIGITAL CONVERTER

(71) Applicant: Altera Corporation, San Jose, CA (US)

(72) Inventors: Chiew Khiang Kuit, Bukit Mertajam (MY); Chee Lam Ng, Bayan Lepas (MY); Tze Sin Tan, Gelugor (MY); Nen Wei Ng, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 15/079,672

(22) Filed: Mar. 24, 2016

(51) Int. Cl.
*G06F 17/50* (2006.01)
*G01R 31/3177* (2006.01)

(52) U.S. Cl.
CPC .................. *G01R 31/3177* (2013.01)

(58) Field of Classification Search
CPC ........................................................ H03M 1/12
USPC ........................................ 716/104, 106, 136
See application file for complete search history.

(56) References Cited

U.S. PATENT DOCUMENTS

| | | | |
|---|---|---|---|
| 5,185,607 A * | 2/1993 | Lyon et al. | H03M 1/108 324/73.1 |
| 6,300,889 B1 | 10/2001 | Piasecki | |
| 6,333,706 B1 * | 12/2001 | Cummings et al. | H03M 1/108 341/120 |
| 6,658,368 B2 | 12/2003 | Wagner et al. | |
| 7,062,401 B1 * | 6/2006 | McGrath et al. | H03M 1/1095 341/120 |
| 7,327,153 B2 | 2/2008 | Weinraub | |
| 7,774,154 B2 | 8/2010 | Sato et al. | |
| 8,319,509 B1 * | 11/2012 | Stayer et al. | H03M 1/1071 324/750.01 |
| 8,947,276 B1 * | 2/2015 | Yu et al. | H03M 1/1095 341/118 |
| 9,106,247 B2 | 8/2015 | Hamilton et al. | |
| 9,184,759 B1 * | 11/2015 | Yu et al. | H03M 1/1095 |
| 2003/0220758 A1 * | 11/2003 | Nishimura et al. | H03M 1/109 702/117 |
| 2010/0103006 A1 * | 4/2010 | Miyake et al. | H03M 1/109 341/120 |
| 2010/0156681 A1 * | 6/2010 | Christ | H03M 1/109 341/120 |

* cited by examiner

*Primary Examiner* — Sun Lin

(57) ABSTRACT

The present invention discloses a method of testing an analog-to-digital converter (ADC). The method includes receiving a series of analog signals from a tester site, converting the series of analog signals to a series of digital code words using an ADC, evaluating the ADC based on the series of digital code words using an ADC test setup and generating an output signal identifying whether the ADC has passed the testing.

23 Claims, 7 Drawing Sheets

METHOD AND APPARATUS FOR USING PROGRAMMABLE LOGIC CIRCUITRY TO TEST ON-CHIP ANALOG-TO-DIGITAL CONVERTER

BACKGROUND

The approaches described in this background section could be pursued, but are not necessarily approaches that have been previously conceived or pursued. Therefore, unless otherwise indicated herein, the approaches described in this section are not known to be prior art to the claims in this application and are not admitted to be prior art by inclusion in this section.

An analog to digital converter (ADC) is an electronic system, circuit, or a module that converts analog input signals to digital code words. The industry-accepted basis for testing ADCs is a comparison of a known count of each of the digital code words for an ideal ADC for a given input to the actual count of each of the digital code words of a device under test. An ideal ADC is a theoretical concept, and cannot be implemented in real life. It has infinite resolution, where every possible analog input signal gives a unique digital code word from the ADC within the specified conversion range.

A common method of testing an ADC device under test employs a histogram whereby a tester signal composed of a series of analog signals from a tester site is applied to the ADC, which converts the series of analog signals to a series of digital code words. The series of digital code words are recorded in memory relating to each voltage level applied at the input. The tester signal is designed so that it has a known probability density function (PDF) of expected values of the series of digital code words.

A typical ADC test setup includes different hardware units such as a signal generator, a clock generator, a system or device for data acquisition (for example an interface to a personal computer (PC) data-acquisition (DAQ) card or a printer port) and logic for data analysis. The signal generator, which may be an arbitrary waveform generator, is used to provide the test signal to the ADC. A clock generator synchronizes the conversion process and transfers the output series of digital code words to the logic for data analysis through the data acquisition device. The data analysis logic builds a histogram by storing the values of each digital code word in the series of digital code words in appropriate histogram bins wherein the histogram bins are storage locations in a memory. The data analysis logic then analyses the histogram data and determines whether the ADC passed the testing.

The ADC test setup described above has several problems. This setup is distributed with the ADC being formed on a separate device from the data acquisition device and the data analysis logic. This setup is also costly and of limited use since it serves a singular purpose of ADC testing. The typical ADC testing system does not have the capability to automatically change the digital words directly into histogram. The typical system makes use of a personal computer to keep all digital words in storage and to handle and change the digital data into a histogram format before performing the analysis to identify a pass/fail result. Furthermore, analysis of the histogram data requires large volume of sampled data and consequently large storage space to be reserved at runtime. For example, a 12-bit ADC can generate $2^{12}$ (or 4096) distinct code words. Assuming every digital code word must be digitized once, the system needs to allocate 4096 memory spaces to store the 12-bit digital value for each digital code word, totaling 4096 times 12 bits. In a typical test setup, each of the digital code words is repeated at least 500 times in order to meet the required sample size for different statistical analysis. Therefore, the test setup needs to preserve at least 500 times 4096 times 12 bits (24 Megabits) of storage space during runtime for testing an ADC. Thus, there exists a need for an on-chip histogram testing solution that requires less storage space during runtime.

SUMMARY

Embodiments described herein include methods of initializing a memory device and an initialization apparatus. It should be appreciated that the embodiments can be implemented in numerous ways, such as a process, an apparatus, a system, a device, or a method. Several embodiments are described below.

In one embodiment, a test system is disclosed. The test system may include a tester site that generates a series of analog signals. The test system may also include an analog-to-digital converter (ADC) implemented on a semiconductor chip such that the ADC receives the series of analog signals from the tester site and converts the series of analog signals to a series of digital code words. The test system may also include ADC testing circuitry formed in programmable logic circuitry on the semiconductor chip such that the ADC testing circuitry is communicatively coupled to the tester site and the ADC. Further, the ADC testing circuitry may run a testing operation on the ADC based on the series of digital code words and generates an output signal identifying whether the ADC passed or failed the testing operation.

In another embodiment, the ADC testing circuitry may further include gatekeeping circuitry such that the gatekeeping circuitry receives a digital code word in the series of digital code words from the ADC. The ADC testing circuitry may also include read-write circuitry coupled to the gatekeeping circuitry such that the read-write circuitry updates a data storage circuitry according to the series of digital code words. The data-storage circuitry may be coupled to the read-write circuitry and operating to store data. The ADC testing circuitry may include analysis circuitry such that the analysis circuitry generates the output signal according to the data stored in the data storage circuitry.

In still another embodiment, a method of testing an ADC is disclosed. The method may include an operation to receive, using gatekeeping circuitry, a digital code word in a series of digital code words from an ADC. The method may also include an operation to update a location in data storage circuitry using read-write circuitry such that an address of the location is specified by a bit configuration of the digital code word. The method may further include an operation to repeat the operations to receive and update for successively received digital code words. The method may include an operation to analyze a data in the data storage circuitry using analysis circuitry. The method may also include an operation to generate an output signal identifying whether the ADC passed the testing using the analysis circuitry.

In an embodiment, a method of resetting the data storage circuitry is disclosed. The method may include an operation to access each discrete address location sequentially using the memory clear circuitry. The method may further include an operation to write a null value to the each discrete address location using the memory clear circuitry.

In another embodiment, a method of receiving the digital code word is disclosed. The method may include an operation to update a signal received count using the gatekeeping circuitry. In response to determining that the signal received count is greater than the signal received limit, the method may include an operation to determine whether the signal received count is greater than a signal received limit using the gatekeeping circuitry. The method may also include operations to discard the digital code word and send a halt signal to the ADC to halt sending subsequent digital code words using the gatekeeping circuitry. In response to determining that the signal received count is not greater than the signal received limit, the method may include an operation to forward the digital code word to the read-write circuitry using the gatekeeping circuitry.

In still another embodiment, generating the output signal may further include an operation to analyze a data stored in the data storage circuitry according to a quality parameter using the analysis circuitry. In another embodiment, the quality parameter may include at least one of a group consisting of: differential non-linearity, integral non-linearity, signal to noise ratio, total harmonic distortion, signal to noise and distortion, and offset check.

In yet another embodiment, a method for determining whether the output signal indicates that the ADC passed or failed the testing using a unit review mechanism is disclosed. In response to determining that the ADC passed the testing, the method may further include an operation to certify that the ADC passed the testing using the unit review mechanism. In response to determining that the ADC failed the testing, the method may include an operation to discard the ADC using the unit review mechanism.

In an embodiment, a method of debugging the data storage circuitry using a debugging circuitry is disclosed. The method may include an operation to read the count stored at a location in the data storage circuitry. The method may also include an operation to pause the updating of the data storage circuitry using the debugging circuitry. The method may also include an operation to export the count.

In another embodiment, a sending a select signal to the read-write circuitry using a selecting circuitry is disclosed. The method may further the select signal indicating to the read-write circuitry to perform one of the following operations: resetting the data storage circuitry, debugging the data storage circuitry, updating the data storage circuitry, and generating the output signal.

In still another embodiment a test system is disclosed. The test system may further include a signal generator that generates a series of analog signals. The test system may also include an integrated circuit. The test system may further include a data converter circuitry on the integrated circuit, wherein the data converter circuitry converts the generated analog signal into a converted signal. The test system may include a histogram generation circuitry on the integrated circuit, wherein the histogram generation circuitry generates a histogram based on the converted signal. The test system may also include an analysis circuitry on the integrated circuit, wherein the analysis circuitry performs pass-fail testing the data converter circuitry based on the generated histogram.

DETAILED DESCRIPTION

Embodiments of the present invention relate to integrated circuits with logic circuitry. The integrated circuits may be any suitable type of integrated circuit, such as microprocessors, application-specific integrated circuits, digital signal processors, memory circuits, or other integrated circuits. If desired, the integrated circuits may be programmable integrated circuits that contain programmable logic circuitry. The present invention will generally be described in the context of integrated circuits such as programmable logic device (PLD) integrated circuits as an example. In the following description, the terms 'circuitry' and 'circuit' are used interchangeably.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Several features are described hereafter that can each be used independently of one another or with any combination of other features. However, any individual feature may not address any of the problems discussed above or might only address one of the problems discussed above. Some of the problems discussed above might not be fully addressed by any of the features described herein.

Figure 1:
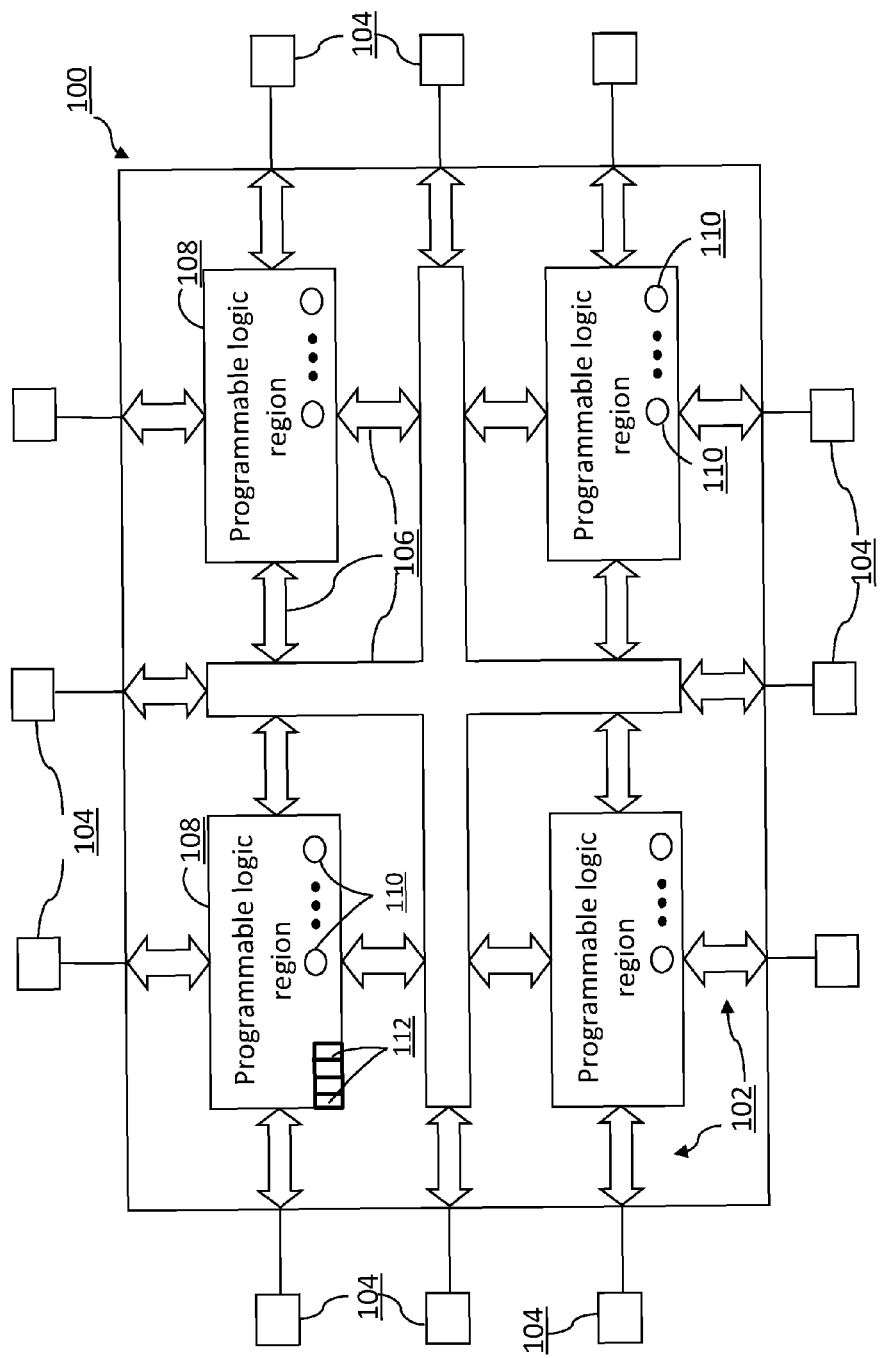
FIG. 1 illustrates an exemplary programmable logic device circuit in accordance with an embodiment of the present invention.

FIG. 1 illustrates a programmable logic device circuit in accordance with an embodiment of the present invention. In FIG. 1, a programmable logic device (PLD) circuit 100 may include input-output circuitry 102 for driving signals of device circuit 100 and for receiving signals from other devices via input-output pins 104. Interconnect circuit 106 may comprise resources such as global and local vertical and horizontal conductive lines and buses may be used to route signals on PLD circuit 100. An interconnect circuit 106 includes conductive lines and programmable connections between respective conductive lines and are therefore sometimes referred to as programmable interconnects.

PLD circuit 100 may include programmable logic 108 that can be configured to perform a custom logic function. Programmable logic 108 may include combinational and sequential logic circuitry. Interconnect circuit 106 may be considered to be a type of programmable logic 108.

PLD circuit 100 may also contain programmable memory elements 110. Memory elements 110 can be loaded with configuration data (also called programming data) using pins 104 and input-output circuitry 102. Once loaded, the memory elements may each provide a corresponding static control signal that controls the operation of an associated logic component in programmable logic 108. In a typical scenario, the outputs of the loaded memory elements 110 are applied to the gates of metal-oxide-semiconductor transistors in programmable logic 108 to turn certain transistors on or off and thereby configure the logic in programmable logic 108 and routing paths. Programmable logic circuit elements that may be controlled in this way include pass transistors, parts of multiplexers (e.g., multiplexers used for forming routing paths in interconnect circuit 108), look-up tables, logic arrays, various logic gates, etc.

Memory elements 110 may be implemented using any suitable volatile and/or non-volatile memory structures such as random-access-memory (RAM) cells, fuses, antifuses, programmable read-only-memory memory cells, mask-programmed and laser-programmed structures, resistive memory structures, combinations of these structures, etc. Because memory elements 110 are loaded with configuration data during programming, memory elements 110 are sometimes referred to as configuration memory, configuration RAM (CRAM), or programmable memory elements.

The circuitry of PLD circuit 100 may be organized using any suitable architecture. As an example, the logic of PLD circuit 100 may be organized in a series of rows and columns of larger programmable logic regions each of which contains multiple smaller logic regions. The smaller regions may be, for example, regions of logic that are sometimes referred to as logic elements (LEs), each containing a look-up table (LUT), one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (as an example). The larger regions may be, for example, logic array blocks (LABs) containing multiple logic elements or multiple ALMs. In the example of FIG. 1, illustrative logic regions 112 (which may be, for example, LEs or ALMs) are shown in one of the larger regions of programmable logic 108 (which may be, for example, a logic array block). In a typical PLD circuit 100, there may be hundreds or thousands of smaller logic regions 112. The logic regions 112 that are shown in FIG. 1 are merely illustrative.

During device programming, configuration data is loaded into PLD circuit 100 that configures the programmable logic regions 112 and programmable logic regions 108 so that their logic resources perform desired logic functions on their inputs and produce desired output signals. For example, CRAM cells are loaded with appropriate configuration data bits to configure adders and other circuits on device 100 to implement desired custom logic designs.

The resources of PLD circuit 100 such as programmable logic 208 may be interconnected by interconnect circuit 106. Interconnect circuit 106 generally includes vertical and horizontal conductors. These conductors may include global conductive lines that span substantially all of device 100, fractional lines such as half-lines or quarter lines that span part of PLD circuit 100, staggered lines of a particular length (e.g., sufficient to interconnect several logic array blocks or other such logic areas), smaller local lines, or any other suitable interconnection resource arrangement. If desired, the logic of PLD circuit 100 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, PLD circuit 100 generally also includes some programmable logic associated with the programmable interconnects, memory, and input-output circuitry on PLD circuit 100. For example, input-output circuitry 102 may contain programmable input and output buffers. Interconnect circuit 106 may be programmed to route signals to a desired destination.

Figure 2:
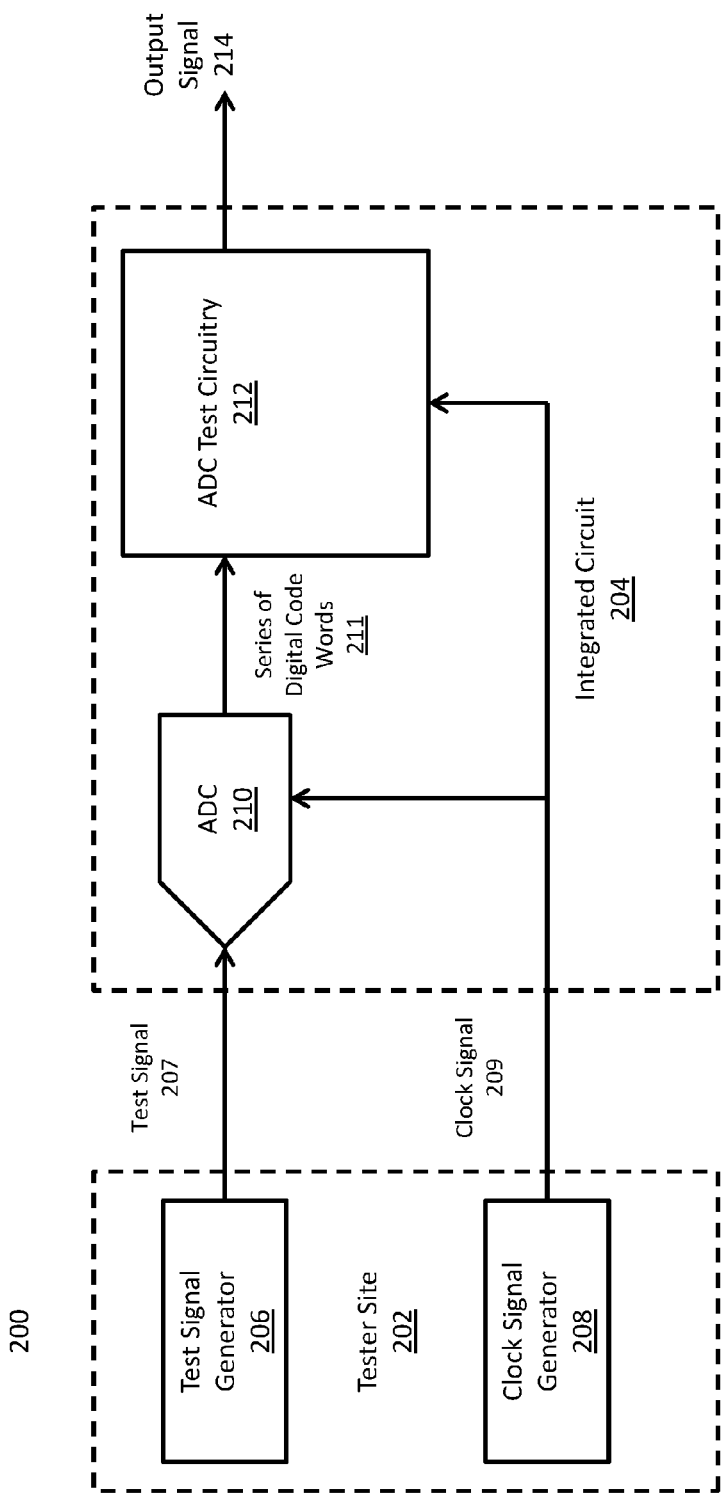
FIG. 2 illustrates an exemplary test system for testing an ADC in accordance with an embodiment of the present invention.

FIG. 2 illustrates an example test system for testing an ADC in accordance with an embodiment of the present invention. For the purposes of illustrating clear examples, test system 200 of FIG. 2 will be discussed in relation to PLD circuit 100 of FIG. 1. Referring now to FIG. 2, test system 200 includes a tester site 202 coupled to an integrated circuit 204. In an embodiment, tester site 202 includes a test signal generator 206 and a clock signal generator 208. Integrated circuit 204 includes an ADC 210 and ADC testing circuitry 212. In an embodiment, integrated circuit 204 may be similar to PLD circuit 100 described above. Integrated circuit 204 may also be referred to as a "design-for-test" (DFT) circuit.

Test signal generator 206 generates a test signal 207 and clock signal generator 208 generates a clock signal 209. Test signal 207 may include a series of analog signals. Test signal 207 and clock signal 209 are sent to ADC 210, which converts each analog signal of test signal 207 to one or more digital code words. This series of digital code words 211 is the output from the ADC. The conversion process is synchronized according to clock signal 209 received by ADC 210. Series of digital code words 211 and clock signal 209 are sent to ADC testing circuitry 212. After receiving and storing a count for each digital code word of the series of digital code words 211, ADC testing circuitry 212 may analyze the data to determine whether ADC 210 has passed testing (e.g., whether ADC 210 has satisfactory or unsatisfactory performance) and may generate an output signal 214 based on the determination.

Referring again to FIG. 2, the tester site includes a signal generator 206 and a clock signal generator 208. In an embodiment, tester site 202 is located on the same computing system or integrated circuit as integrated circuit 204. In another embodiment, tester site 202 is located on a different computing system or integrated circuit from the ADC test setup and is coupled to integrated circuit 204 by a network connection. In an embodiment, tester site 202 is specialized hardware or software executing on a computing system for evaluating ADC 210.

Test signal generator 206 may be, for example, a reference-voltage supply circuit that can be implemented with a bandgap voltage reference. Similarly, test signal 207 may be a triangle signal that changes from one volt to zero volt and back to one volt. In an embodiment, the test signal includes a series of analog input signals. In an embodiment, each analog signal of test signal 207 has its associated expected amplitude stored as an expected count of each digital code words or range of digital code words in test signal generator 206. The expected count of each digital code words or range of expected digital code words is the count of each digital code word in series of digital code words 211, if ADC 210 being tested is an ideal ADC as described above. In an embodiment, the expected count is stored at an external storage location or at a storage location at integrated circuit 204. Clock signal generator 208 generates clock signal 209 to synchronize the conversion process as carried out by ADC 210 and the testing process as carried out by ADC testing circuitry 212.

Referring again to FIG. 2, integrated circuit 204 includes ADC 210 and ADC testing circuitry 212. In an embodiment, integrated circuit 204 is implemented on a semiconductor chip comprising programmable logic regions such as programmable logic region 108 of PLD circuit 100. For example, integrated circuit 204 may be implemented on a semiconductor chip that also comprises an FPGA as a part of a system on chip (SOC). In an embodiment, ADC 210 and ADC testing circuitry 212 are connected via interconnect circuit 106. In an embodiment, ADC 210 is a hard intellectual property (IP) block on PLD circuit 100.

ADC 210 receives test signal 207 from test signal generator 206 and converts test signal 207 to series of digital code words 211 at a rate determined by clock signal 209 generated by clock signal generator 208. In an embodiment, series of digital code words 211 from ADC 210 is preferably in the form of n-bit parallel data. For example, an n-bit ADC will normally output $2^n$ different digital code words, depending on the analog input level. Series of digital code words 211 reflect the distribution of digital code words produced by ADC 210. Series of digital code words 211 is sent to ADC testing circuitry 212. ADC testing circuitry 212 receives and processes series of digital code words 211 to produce an output signal 214 that indicates whether ADC 210 has passed the testing or whether ADC 210 is defective (e.g., has failed testing).

Figure 3:
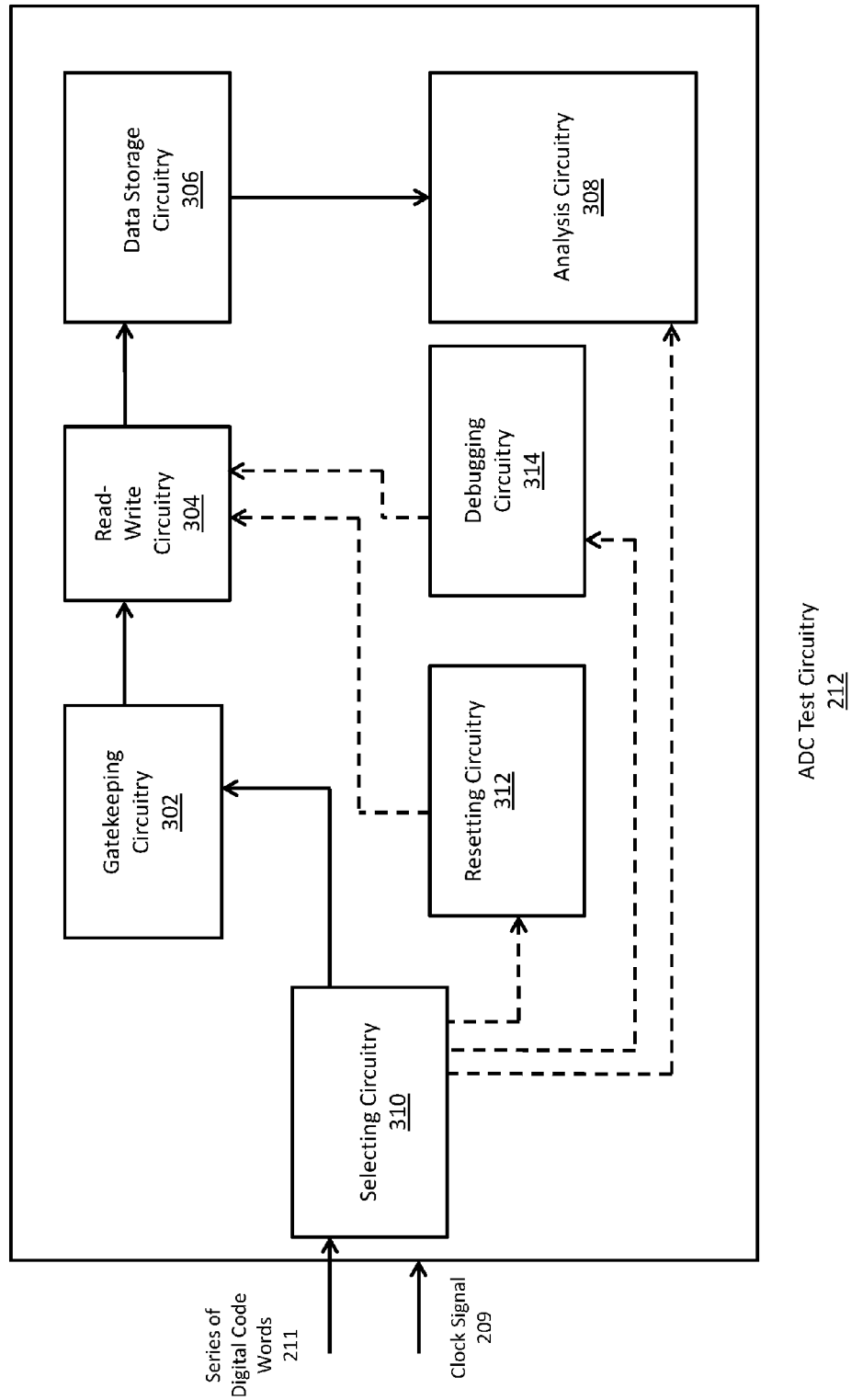
FIG. 3 illustrates an exemplary ADC testing circuitry in accordance with an embodiment of the present invention.

FIG. 3 illustrates an example ADC testing circuitry in accordance with an embodiment of the present invention. For the purposes of illustrating clear examples, FIG. 3 will be discussed in relation to test system 200 of FIG. 2 and PLD circuit 100 of FIG. 1.

Referring now to FIG. 3, ADC testing circuitry 212 further includes selecting circuitry 310, gatekeeping circuitry 302, read-write circuitry 304, data storage circuitry 306, analysis circuitry 308, resetting circuitry 312, and debugging circuitry 314. In an embodiment, selecting circuitry 310 is communicatively coupled to gatekeeping circuitry 302, resetting circuitry 312, debugging circuitry 314, and analysis circuitry 308. In an embodiment, the gatekeeping circuitry is communicatively coupled to the read-write circuitry 304. In an embodiment, the read-write circuitry is communicatively coupled to resetting circuitry 312, debugging circuitry 314, and data storage circuitry 306. In an embodiment, data storage circuitry 306 is communicatively coupled to analysis circuitry 308. In an embodiment, the various components of ADC testing circuitry 212 are formed in the programmable logic region 108 of a PLD circuit 100. For example, ADC testing circuitry 212 may be formed in the programmable logic region of a FPGA. In an embodiment, the various components of ADC testing circuitry 212 are connected to each other via interconnect circuit 106. In an embodiment, ADC testing circuitry receives clock signal 209 from clock generator 208. Clock signal 209 synchronizes the various operations of ADC testing circuitry 212. In an embodiment, ADC testing circuitry receives series of digital code words 211 at selecting circuitry 310.

Selecting circuitry 310 is used to select between the different modes for operating ADC testing circuitry 212. In an embodiment, selecting circuitry 310 is a de-multiplexer that selects the appropriate mode of operation. For example, the selecting circuitry 312 may be a 2-bit de-multiplexer with an operation select table as defined below:

| Selection Bit-Sequence | Process |
| --- | --- |
| 00 | Debugging |
| 01 | Storing |
| 10 | Memory Clearing |
| 11 | Analyzing |

In an embodiment, a user selects the operating mode for ADC testing circuitry 212. In another embodiment, ADC testing circuitry 212 automatically selects the operating mode by asserting the appropriate bit configuration.

Referring again to FIG. 3, in an embodiment where ADC testing circuitry 212 is selected to operate in the storing mode or debugging mode by asserting the appropriate bit-sequence through selecting circuitry 310, selecting circuitry 310 may receive a series of digital code words 211 from ADC 210 and forward it to gatekeeping circuitry 302. Gatekeeping circuitry 302 serves to control the number of digital code words received by the read-write circuitry 304. In an embodiment, gatekeeping circuitry 302 updates a count after receiving each digital code word in series of digital code words 211 and compares the count to a value indicating the maximum number of digital code words required to test ADC 210. In an embodiment, if the count exceeds the value, gatekeeping circuitry 302 stops the storing operation by asserting a stop signal to ADC 210. In yet another embodiment, the value is pre-determined by a user of Integrated circuit 204. In still another embodiment, the value is determined automatically by ADC testing circuitry 212. In an embodiment, the value is based on the parameters according to which ADC 210 is being tested. In another embodiment, the value may represent the maximum number of digital code words required to debug ADC 210 during a debugging operation using debugging circuitry 314.

Referring again to FIG. 3, the read-write circuitry 304 is responsible for updating data storage circuitry 306. In an embodiment, the read-write circuitry 304 is controlled by gatekeeping circuitry 302, resetting circuitry 312, and debugging circuitry 314 depending upon the mode of operation of ADC testing circuitry 212. In an embodiment, the read-write circuitry 304 receives series of digital code words 211 from gatekeeping circuitry 302. In an embodiment, clock signal 209 synchronizes the read-write circuitry 304 with data storage circuitry 306. In another embodiment, read-write circuitry 304 updates a location in data storage circuitry 306 and the address of the location corresponds to the bit configuration of series of digital code words 211. In still another embodiment, the read-write circuitry 304 may include specialized circuitry to update a location in data storage circuitry 306 by incrementing a count stored at the location by one.

Referring again to FIG. 3, data storage circuitry 306 stores the counts associated with different digital code words of series of digital code words 211 in locations whose addresses are specified by the bit configuration of the digital code words. In an embodiment, the count values form a representative histogram specifying the distribution of digital code words as converted from test signal 207. In another embodiment, data storage circuitry 306 is similar to the memory elements 110 described in FIG. 1. In still another embodiment, a user determines the memory space associated with data storage circuitry 306. In yet another embodiment, the memory space associated with data storage circuitry 306 is determined automatically based on the parameters according to which ADC 210 is being tested. In an embodiment, the memory space associated with data storage circuitry 306 is determined according to the number of test signals 207 accepted by gatekeeping circuitry 302 that are required to test ADC 210.

Referring again to FIG. 3, analysis circuitry 308 may analyze the data stored in data storage circuitry 306 and generate an output signal 214 to indicate whether ADC 210 has passed the testing. In an embodiment, analysis circuitry 308 is operable upon selection of the analyzing mode by selecting circuitry 310. In another embodiment, the analysis circuitry is formed in the programmable logic region 108 of PLD circuit 100 in response to the parameter according to which ADC 210 is being tested. In an embodiment, analysis circuitry 308 is formed in response to the selection of a parameter by a user.

For example, the data stored in data storage circuitry 306 may be analyzed based on different well-known ADC parameters such as differential non-linearity (DNL), integral non-linearity (INL), gain error, offset error, signal to noise ratio (SNR) etc. Each of these parameters has a mathematical expression. For example, DNL serves as a parameter for measuring the deviation between the actual occurrences versus the theoretical occurrences of the particular digital code word when same analog input was applied to ADC 210 under testing. Similarly, INL is the maximum difference between the ideal and actual digital code word transition levels after correcting for gain and offset errors. Furthermore, each of these parameters have their own mathematical formulae based on which analysis circuitry 308 analyses ADC 210. For example, DNL is calculated by: DNL(n)= (Actual Hit(n)/Theoretical Hit(n))−1. Persons having ordinary skill in the art will appreciate that in addition to DNL, INL, gain error, offset error, and SNR there are several well-known other parameters each with their own mathematical expressions according to which an ADC 210 might be tested.

Referring now to FIG. 3, resetting circuitry 312 may reset data storage circuitry 306 using the read-write circuitry 304. Data storage circuitry 306 may need resetting and the contents of the various storage locations may need to be cleared before ADC test circuitry 212 is operated in the storing mode to clear the contents pertaining to a previous testing or storing operation. In an embodiment, ADC testing circuitry 212 directs the read-write circuitry 304 to systematically access each storage location of data storage circuitry 306 and write null values to the storage locations. In another embodiment, the resetting operation is synchronized according to clock signal 209. In still another embodiment, resetting circuitry 312 initializes the count stored at each storage location of data storage circuitry 306 to zero.

Referring again to FIG. 3, debugging circuitry 314 enables debugging of ADC test circuitry 212. Debugging operations may be required from time to time to ensure that ADC testing circuitry 212 is operating within established quality parameters. If ADC testing circuitry 212 starts to present too many false positives by rejecting functional ADCs or if ADC testing circuitry 212 starts allowing too many defective ADCs to pass testing, then there might be an error with one or more processes related to testing the ADCs. For example, there may be some errors related to clearing data storage circuitry 306, an error in reading or writing the data to data storage circuitry 306, or logic in analysis circuitry 308. Thus, debugging circuitry 314 enables testing of the different components within ADC testing circuitry 212.

The debugging circuitry is communicatively coupled to the read-write circuitry 304 and can therefore access data storage circuitry 306 and analysis circuitry 308. In an embodiment, the debugging circuitry may include a number of input and output pins to input debugging data directly to the read-write circuitry 304 and to output data received from data storage circuitry 306 or analysis circuitry 308. In another embodiment, the debugging operation of debugging circuitry 314 may be synchronized according to clock signal 209. In yet another embodiment, debugging circuitry 314 may test data storage circuitry 306 by comparing the count stored at the various locations in data storage circuitry 306 to expected counts for a digital code word in series of digital code words 211. In still another embodiment, a user compares the count and the expected count to determine whether data storage circuitry 306 is malfunctioning.

Figure 4:
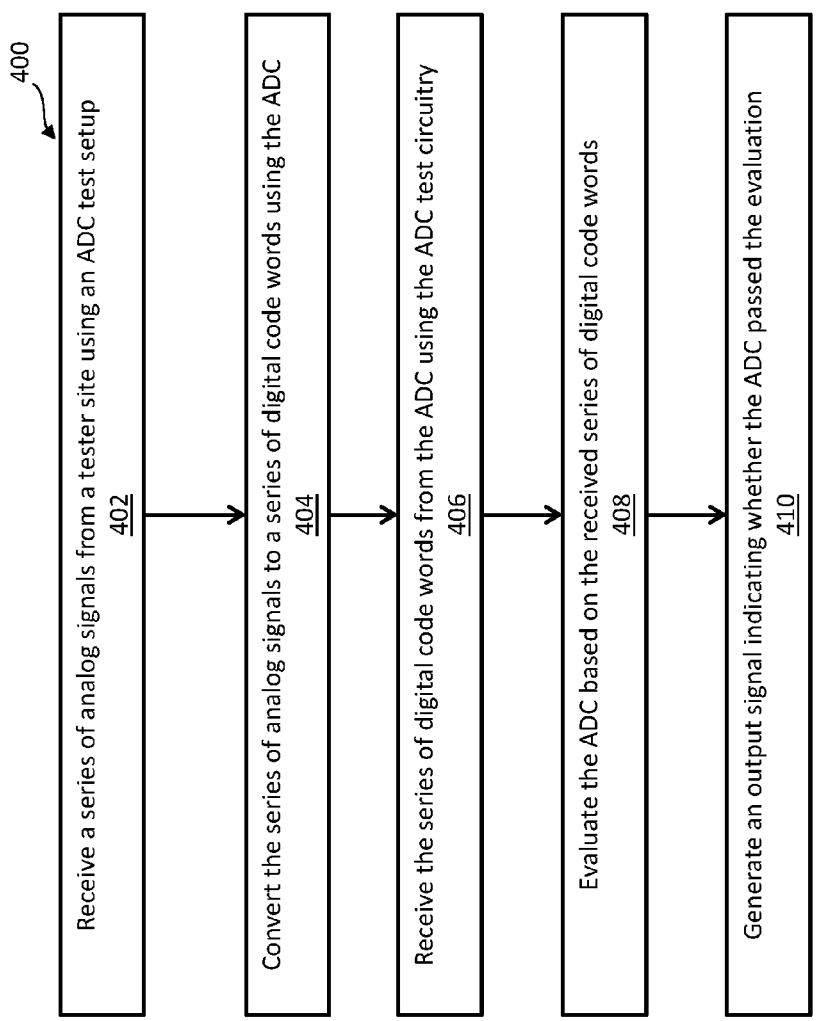
FIG. 4 illustrates an exemplary method of operating a test system in accordance with an embodiment of the present invention.

FIG. 4 illustrates a flow chart 400 of exemplary method steps for operating integrated circuit 204 in accordance with an embodiment of the present invention. For the purposes of illustrating clear examples, the process depicted in FIG. 4 will be described in connection with PLD circuit 100 of FIG. 1 and tester site 202 and integrated circuit 204 of FIG. 2. However, a same or substantially similar process can be utilized in other implementations.

Referring now to FIG. 4, at step 402, integrated circuit 204 may receive test signal 207 from tester site 202. The process then moves to step 404.

At step 404, ADC 210 of integrated circuit 204 may convert each analog input signal of test signal 207 to digital code word or words that form series of digital code words 211. In an embodiment, the conversion process is synchronized by a clock signal 209 supplied by a clock signal generator 208 at tester site 202. For example, in case of a two-bit ADC the test signal may be a triangle signal that changes from one volt to zero volts and back to one volt. Therefore, a 2-bit ADC will have four digital code words ($2^2$=4). These digital code words may be 00, 01, 10, and 11. The digital code words form series of digital code words 211.

At step 406, ADC test circuitry 212 may receive series of digital code words 211 from ADC 210. In an embodiment, ADC test circuitry 212 also receives clock signal 207. For example, the ADC test circuitry 212 may receive series of code words 00, 01, 10, 11 as series of digital code words 211.

At step 408, ADC test circuitry 212 may evaluate ADC 210 based on the received series of digital code words 211. In an embodiment, ADC test circuitry 212 performs histogram-based testing and analysis on series of code words 211 obtained from ADC 210 according to a set of parameters and compares the results for ADC 210 with results for an ideal ADC. The operation of ADC test circuitry 212 is discussed below in relation to FIG. 5.

At step 410, ADC test circuitry 212 may generate output signal 214 indicating whether ADC 210 passed testing or whether the ADC is defective. In an embodiment, output signal 214 is generated after comparing the results of the analyzing operation to the theoretical results from analyzing an ideal ADC. In an embodiment, output signal 214 is a bit configuration signifying whether ADC 210 passed the testing. For example a one-bit output signal has two possible configurations where 0 indicates that an ADC passed testing and 1 indicates that the ADC failed the testing or vice versa. In another embodiment, output signal 214 is analyzed by a user to determine whether ADC 210 passed the testing. In still another embodiment, output signal 214 includes histogram data generated during the testing and evaluation of ADC 210.

If desired, test system 200 may perform testing operations on multiple devices (e.g., on ADCs 210 on multiple integrated circuits 204). Test system 200 may include, for example, device characterization equipment such as unit review equipment. The unit review equipment in test system 200 may receive output signal 214 from on-chip test circuitry 212 on each integrated circuit that is tested. The unit review equipment may determine whether each ADC 210 passes or fails testing (e.g., whether the ADC has satisfactory or unsatisfactory performance). If a given ADC 210 has passed testing, the unit review equipment may certify the ADC as passing the testing operations. The integrated circuit having the certified ADC may then be further manufactured, incorporated into other devices or structures, or otherwise provided to an end user of the integrated circuit. If a given ADC 210 has failed testing, the unit review equipment may discard or scrap that ADC 210 and/or the corresponding integrated circuit 204 or may flag the ADC to be reworked. For example, if a given ADC 210 has failed testing, the unit review equipment may instruct manufacturing equipment and/or a user of the test system to install a new ADC onto integrated circuit 204.

Figure 5:
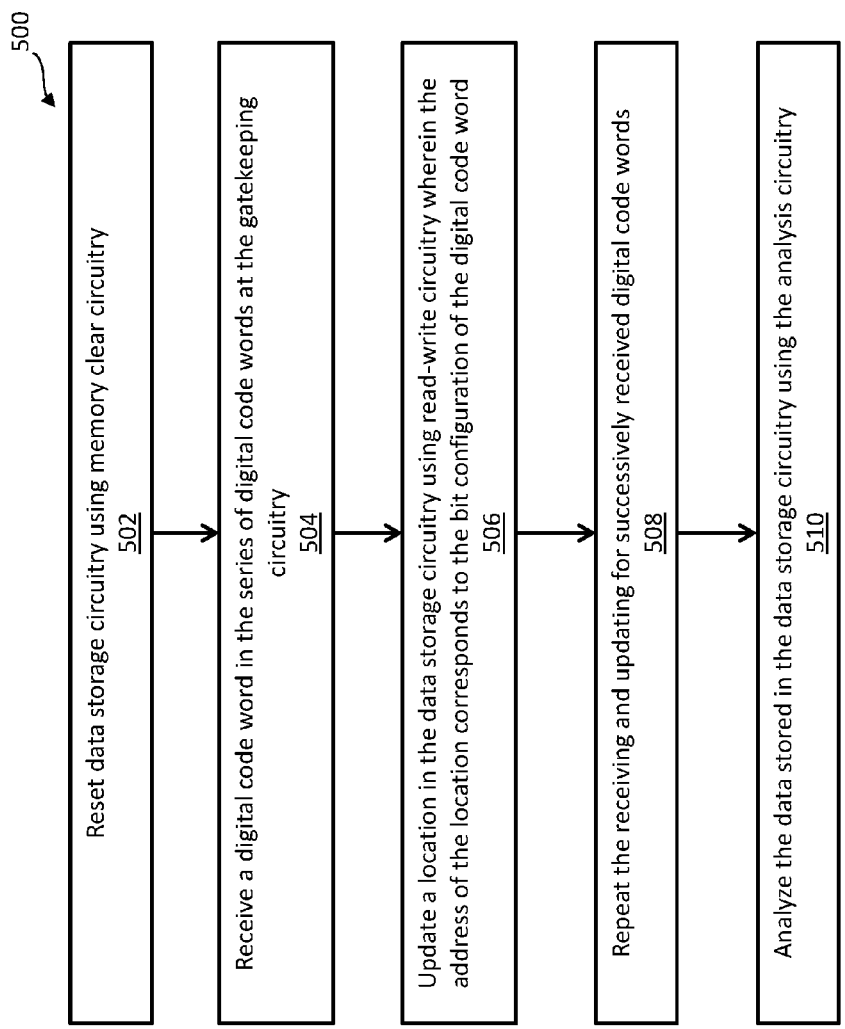
FIG. 5 illustrates an exemplary method of operating an ADC testing circuitry in accordance with an embodiment of the present invention.

FIG. 5 illustrates a flow chart 500 of exemplary method steps for operating ADC testing circuitry 212 to test an ADC 210 in accordance with an embodiment of the present invention.

Referring now to FIG. 5, the process begins with ADC test circuitry 212 receiving series of digital code words 211 from ADC 210. In an embodiment, ADC test circuitry 212 may also receive a bit configuration to select the appropriate mode of operation. In an embodiment, the bit configuration is received from ADC 210, tester site 202, or some other component in integrated circuit 204. In another embodiment, the bit configuration may be received from a user. For example, ADC test circuitry may be configured according to the table for the selecting circuit 302 described in FIG. 3. ADC test circuitry 212 receives the bit configuration '01' and selecting circuitry 310 initiates the storing operation by selecting the storing mode for ADC test circuitry 212.

At step 502, resetting circuitry 312 may reset data storage circuitry 306. In an embodiment, the resetting circuitry 312 initiates the resetting operation by asserting a memory clear signal to data storage circuitry 306 via read-write circuitry 304. In another embodiment, after receiving the memory clear signal from resetting circuitry 312, read-write circuitry 304 systematically accesses each location of data storage circuitry 306 and clears the contents of each location by writing a null value. In still another embodiment, the resetting operation is synchronized according to clock signal 209. For example, if locations 00, 01, 10, 11 in data storage circuitry 306 have data 3, 5, 12, 17, then resetting circuitry asserts the memory clear signal and uses read-write circuitry 304 to write 0 to each location.

At step 504, a digital code word from series of digital code words 211 may be received at gatekeeping circuitry 302. The process of operating gatekeeping circuitry 302 is described below in relation to FIG. 6. In an embodiment, gatekeeping circuitry 302 forwards the digital code word to read-write circuitry 304.

At step 506, a count for the digital code word from series of digital code words 211 may be stored at a location in data storage circuitry 306. The location may correspond to the bit configuration of the digital code word. In an embodiment, the storing operation by read-write circuitry 304 runs concurrently with the converting operation by ADC 210. In another embodiment, read-write circuitry 304 has specialized circuitry to update the count stored at the location by incrementing the count by one. For example, the first code word received at read-write circuitry 304 may be 00 and the count stored at location 00 in data storage circuitry 306 is zero. Then, read-write circuitry 304 accesses location 00 in data storage circuitry 306 and increments the count stored at location 00 by one (i.e. count is updated from zero to one) to indicate that a digital code word with bit configuration 00 has been received.

At step 508, the steps of receiving digital code words and updating counts in corresponding location in data storage circuitry 306 by read-write circuitry 304 are repeated for each digital code word in series of digital code words 211. In an embodiment, the steps are repeated until gatekeeping circuitry 302 stops accepting digital code words from ADC 210. In an embodiment, the counts stored in locations of data storage circuitry 306 form a histogram. The counts represent the actual number of digital code words received. Continuing the example from above, the next digital code word received is 01, and therefore the count stored at location 01 (which may be initialized to zero during the resetting operation) of data storage circuitry 306 is incremented by one. Similarly, the count values for locations 00, 01, 10, 11 are updated according to the number of digital code words received with bit configurations 00, 01, 10, 11 respectively. As an example, after accepting forty code words, the count values of 00, 01, 10, and 11 may be 7, 13, 12, and 8 respectively.

At step 508, analysis circuitry 308 may analyze the data stored in data storage circuitry 306. In an embodiment, the analyzing operation starts automatically after the count for the last digital code word received from gatekeeping circuitry 302 is updated in data storage circuitry 306. In another embodiment, a user initiates the analyzing operation by sending the appropriate bit configuration to selecting circuitry 302. In an embodiment, the data from data storage circuitry 306 is accessed sequentially by analysis circuitry 308. In an embodiment, the data stored in data storage circuitry 306 is loaded into analysis circuitry 308 before beginning the analyzing operation. In an embodiment, the analyzing operation is carried out according to quality parameters determined by a user. The quality parameters include DNL, INL, SNR, and offset error. In another embodiment, a user may specify an error tolerance, as compared to an ideal ADC, for the quality parameter used for analyzing operation.

For example, if the quality parameter selected by the user to test ADC 210 is DNL, then analysis circuitry 308 is configured to compute the mathematical expression DNL (n)=(Actual Hit (n)/Theoretical Hit (n))−1 for calculating the DNL of digital code word n. For example a user may specify an error tolerance of +/−0.5 with respect to an ideal ADC that has a theoretical count of 10 for each digital code word and thus DNL as 0,0,0,0 for each code word. Thus, the data stored in data storage circuitry 306 location 00, 01, 10, 11 i.e. 7, 13, 12, 8 respectively is loaded into analysis circuitry 306. A DNL value for each code word i.e. 00, 01, 10, and 11 is calculated by analysis circuitry 306 to be −0.3, 0.3, 0.2, −0.2. Since these are within the error tolerance limits ADC 210 passes the testing and output signal 214 is generated that indicates that ADC 210 passed the testing.

However, for example, the data stored in data storage circuitry 306 location 00, 01, 10, 11 may be 4, 13, 12, 8 respectively. Then DNL for digital code word 00 is −0.6 which is outside the error tolerance limits (of +/−0.5 with respect to an ideal ADC) specified by the user and therefore ADC 210 will fail the testing output signal 214 will indicate that ADC 210 failed the testing.

Figure 6:
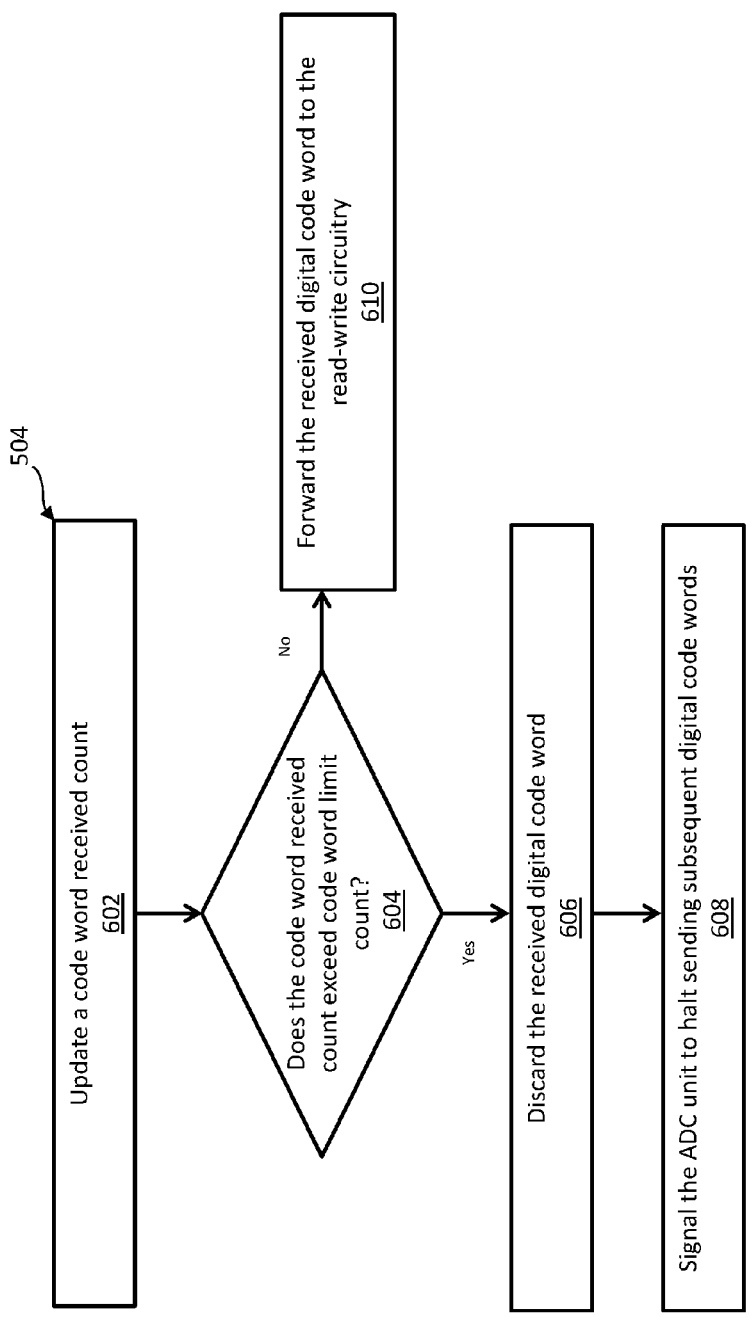
FIG. 6 illustrates an exemplary method of operating a gatekeeping circuitry in accordance with an embodiment of the present invention.

FIG. 6 illustrates an exemplary method of operating a gatekeeping circuitry in accordance with an embodiment of the present invention. For the purposes of illustrating clear examples, the process depicted in FIG. 6 will be described in connection with PLD circuit 100 of FIG. 1 and ADC testing circuitry 212 of FIG. 3. However, a same or substantially similar process can be utilized in other implementations.

At step 504, as described above, gatekeeping circuitry 302 receives a digital code words in series of digital code words 211.

At step 602, gatekeeping circuitry 302 may update a code word received count upon receiving series of digital code words 211. In an embodiment, updating the code word count includes incrementing the code word count by one. For example, if the code word count is four hundred and ninety nine and gatekeeping circuitry 302 receives another series of digital code words 211 then the code word count is incremented by one to five hundred.

At step 604, gatekeeping circuitry 302, may determine whether the code word count exceeds the code word received limit. In an embodiment, the code word limit is pre-determined by a user. For example, the code word limit may be five hundred. Therefore, in the example above, gatekeeping circuitry 302 will compare the code word count (which is five hundred) and compare it with the code word limit (also five hundred) to determine if the code word count exceeds the code word limit. If the code word count does not exceed the code word limit, then the process moves to block 610. However, if the code word count exceeds the code word limit, then the process moves to block 606.

If the process moves to block 606 then gatekeeping circuitry 302 discards the next digital code word in series of digital code words 211. For example the code word count may already be five hundred and a new digital code word is received at gatekeeping circuitry 302. The count is now increased to five hundred and one, which is more than the code word limit of five hundred. Therefore, the new digital code word is discarded and the process moves to block 608.

At step 608, the gatekeeping circuit 302 signals ADC 210 to halt sending subsequent digital code words and the process concludes.

If the process moves to block 610 then gatekeeping circuitry 302 forwards the received digital code word to the read-write circuitry 304 and the process is repeated for subsequently received digital code words. For example, since code word count is equal to the code word limit in the example above (as five hundred is equal to five hundred), the digital code word is forwarded to the read-write circuitry 304.

Persons having ordinary skill in the art will understand that the gatekeeping circuit 302 can use a similar or substantially similar process to execute gatekeeping functions during different modes of operation of ADC test circuitry 212. For example, the gatekeeping circuit 302 may perform a similar function during a debugging operation and determine whether the code word limit for the debugging operation has been satisfied.

Figure 7:
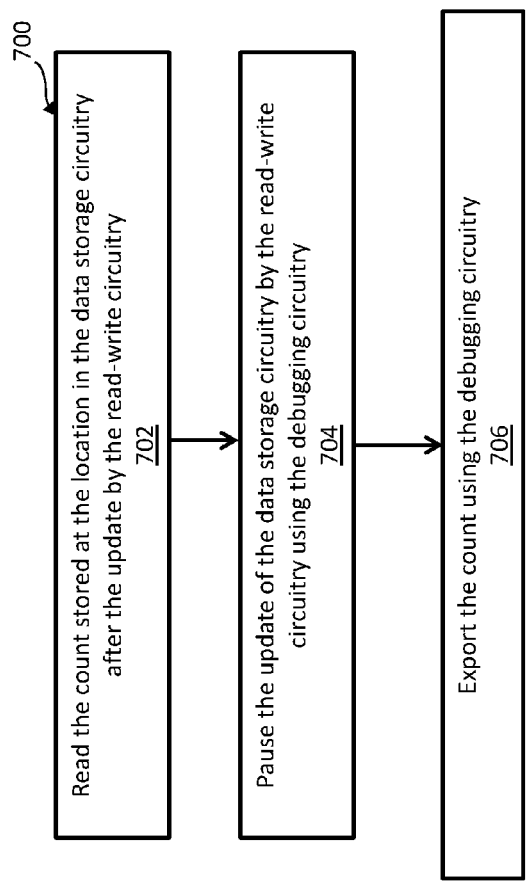
FIG. 7 illustrates an exemplary method of operating a debugging circuitry in accordance with an embodiment of the present invention.

FIG. 7 illustrates an exemplary method of operating a debugging circuitry in accordance with an embodiment of the present invention. For the purposes of illustrating clear examples, the process depicted in FIG. 7 will be described in connection with PLD circuit 100 of FIG. 1 and ADC testing circuitry 212 of FIG. 3. However, a same or substantially similar process can be utilized in other implementations.

At 700, the operating mode for ADC testing circuitry 212 is set to debugging. For example, a user may select the debugging mode by sending bit configuration 00 to the selecting circuit 302. Bit configuration 00 corresponds to debugging mode according to the example described above. The user may then set the input and output pins of debugging circuitry 314 to debug data storage circuitry 306. The process then moves to step 702.

At step 702, debugging circuitry 314 may read the count stored at a location in data storage circuitry 306 after the location has been updated by read-write circuitry 304. In another embodiment, debugging circuitry 314 may read the count stored at a location in the data storage circuitry 314 after the location has been updated directly by a user with debug data using an input pin of debugging circuitry 314. For example, the count at location 00 may be seven after forty digital code words have been accepted by read-write circuitry 304. Debugging circuitry 314 reads the count as seven.

At step 704, debugging circuitry 314 may pause the updating of data storage circuitry 306 by read-write circuitry 304. Thus, in the example above read-write circuitry 304 receives no further digital code words and the count stored at location 00 in data storage circuitry remains seven.

At step 706, debugging circuitry 314 may export the count. In an embodiment, the count is exported to an external device for example an external disk or a display. In another embodiment, the count is compared to the count obtained from another ADC test setup operating under similar testing conditions (input signal, clock signal, quality parameter, sample received limit etc.) to determine whether ADC test circuitry 212 is functioning appropriately. For example, if the exported count is seven but the count from another ADC test setup is 9, then that may indicate errors in the operation of ADC test circuitry 212.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims.

We claim:

1. A test system comprising:
a tester site that generates a series of analog signals;
an analog-to-digital converter (ADC) implemented on a semiconductor chip, wherein the ADC receives the series of analog signals from the tester site and converts the series of analog signals to a series of digital code words; and
ADC testing circuitry formed in programmable logic circuitry on the semiconductor chip, wherein the ADC testing circuitry is communicatively coupled to the tester site and the ADC, and
wherein the ADC testing circuitry performs a testing operation on the ADC based on the series of digital code words received from the ADC to generate an output signal that identifies whether the ADC has passed the testing operation.

2. The test system as defined in claim 1, wherein the ADC testing circuitry further comprises:
gatekeeping circuitry, wherein the gatekeeping circuitry receives a digital code word in the series of digital code words from the ADC;
data-storage circuitry that stores data;
read-write circuitry coupled to the gatekeeping circuitry and the data-storage circuitry, wherein the read-write circuitry updates the data-storage circuitry based on the series of digital code words; and analysis circuitry, wherein the analysis circuitry generates the output signal based on the data stored in the data-storage circuitry.

3. The test system as defined in claim 2, wherein the ADC testing circuitry further comprises:
resetting circuitry coupled to the read-write circuitry, wherein the resetting circuitry resets the data-storage circuitry.

4. The test system as defined in claim 3, wherein the ADC testing circuitry further comprises:
debugging circuitry coupled to the read-write circuitry, wherein the debugging circuitry debugs the data-storage circuitry.

5. The test system as defined in claim 4, wherein the ADC testing circuitry further comprises:
selecting circuitry coupled to the gatekeeping circuitry, the resetting circuitry, the debugging circuitry, and the analysis circuitry, wherein the selecting circuitry generates a select signal that selects a mode of operation for the ADC testing circuitry by selecting one of the gatekeeping circuitry, the resetting circuitry, the debugging circuitry, and the analysis circuitry.

6. The test system as defined in claim 5, wherein the selecting circuitry comprises a de-multiplexer.

7. The test system as defined in claim 5, wherein the ADC and the ADC testing circuitry comprising the resetting circuitry, the gatekeeping circuitry, the read-write circuitry, the selecting circuitry, and the analysis circuitry are formed on a field programmable gate array (FPGA).

8. The test system as defined in claim 2, wherein the data comprises a count of each digital code word in the series of digital code words received by the gatekeeping circuitry.

9. The test system as defined in claim 2, wherein the generating the output signal further comprises analyzing, using the analysis circuitry, the data stored in the data storage circuitry according to a quality parameter.

10. The test system as defined in claim 9, wherein the quality parameter comprises a parameter selected from the group of parameters consisting of: a differential non-linearity parameter, an integral non-linearity parameter, a signal-to-noise ratio parameter, a total harmonic distortion parameter, a signal-to-noise and distortion parameter, and an offset check parameter.

11. The test system as defined in claim 9, wherein the analysis circuitry is formed on a field programmable gate array (FPGA) and tests the ADC based on the quality parameter.

12. The test system defined in claim 1, wherein the semiconductor chip comprises a field programmable gate array (FPGA) and the programmable logic circuitry comprises programmable logic on the FPGA.

13. A method of performing testing operations on an analog-to-digital converter (ADC), the method comprising:
receiving, at gatekeeping circuitry, digital code words in a series of digital code words from the ADC;
updating, using read-write circuitry, locations in data-storage circuitry for each digital code word of the received digital code words, wherein addresses of each location of the locations are identified by a bit configuration of a corresponding received digital code word;
analyzing, using analysis circuitry, data stored in the data-storage circuitry; and
generating, using the analysis circuitry, an output signal identifying whether the ADC passed the testing operations, wherein the receiving digital code words comprises:
receiving a given digital code word at the gatekeeping circuitry,
updating, using the gatekeeping circuitry, a signal received count;
determining, using the gatekeeping circuitry, whether the signal received count is greater than a signal received limit, and
in response to determining that the signal received count is greater than the signal received limit:
discarding, using the gatekeeping circuitry, the given digital code word, and
sending, using the gatekeeping circuitry, a halt signal to the ADC to halt sending subsequent digital code words.

14. The method as defined in claim 13 further comprising:
resetting, using memory clear circuitry, the data-storage circuitry.

15. The method as defined in claim 14, wherein the resetting the data-storage circuitry further comprises:
accessing, using the memory clear circuitry, each discrete address location in the data-storage circuitry sequentially; and
writing, using the memory clear circuitry, a null value to each accessed discrete address location of the accessed discrete address locations.

16. The method as defined in claim 14, further comprising:
sending, using selecting circuitry, a select signal to the read-write circuitry, wherein the select signal instructs the read-write circuitry to perform an operation selected from the group of operations consisting of: resetting the data-storage circuitry, debugging the data-storage circuitry, updating the data-storage circuitry, and generating the output signal.

17. The method as defined in claim 13, further comprising:
receiving, using the ADC, a clock signal, wherein the clock signal synchronizes converting a series of analog signals to the series of digital code words.

18. The method as defined in claim 13, wherein the receiving digital code words further comprises:
in response to determining that the signal received count is less than or equal to the signal received limit, forwarding, using the gatekeeping circuitry, the given digital code word to the read-write circuitry.

19. The method as defined in claim 13, wherein the locations are configured to store counts that are associated with the digital code words and wherein the updating locations further comprises incrementing, using the read-write circuitry, the stored counts.

20. The method as defined in claim 19, further comprising:
debugging, using debugging circuitry, the data-storage circuitry, wherein the debugging comprises:
reading, using the read-write circuitry, the counts stored at the locations after the updating;
pausing, using the debugging circuitry, the updating; and
exporting, using the debugging circuitry, the counts.

21. The method as defined in claim 13, wherein the generating an output signal further comprises analyzing, using the analysis circuitry, the data stored in the data-storage circuitry according to a quality parameter.

22. The method as defined in claim 13, further comprising:
determining, using unit review equipment, whether the output signal indicates that the ADC has passed or failed the testing operations;

in response to determining that the ADC has passed the testing operations, certifying, using the unit review equipment, that the ADC passed the testing operations; and in response to determining the that the ADC has failed the testing operations, discarding, using the unit review equipment, the ADC.

23. A test system comprising:

a tester site that generates a series of analog signals;

an analog-to-digital converter (ADC) implemented on a semiconductor chip, wherein the ADC receives the series of analog signals from the tester site and converts the series of analog signals to a series of digital code words;

ADC testing circuitry formed on the semiconductor chip, wherein the ADC testing circuitry is communicatively coupled to the tester site and the ADC, wherein the ADC testing circuitry performs a testing operation on the ADC based on the series of digital code words received from the ADC to generate an output signal that identifies whether the ADC has passed the testing operation, and wherein the ADC testing circuitry further comprises:

gatekeeping circuitry, wherein the gatekeeping circuitry receives a digital code word in the series of digital code words from the ADC, data-storage circuitry that stores data, and analysis circuitry, wherein the analysis circuitry generates the output signal based on the data stored in the data-storage circuitry, and wherein the data-storage circuitry is interposed between the gatekeeping circuitry and the analysis circuitry.

* * * * *